(12) United States Patent
Huang et al.

(10) Patent No.: US 8,680,565 B2
(45) Date of Patent: Mar. 25, 2014

(54) LIGHT EMITTING DIODE AND FLIP-CHIP LIGHT EMITTING DIODE PACKAGE

(71) Applicant: Genesis Photonics Inc., Tainan (TW)

(72) Inventors: Yi-Ru Huang, Tainan (TW); Chih-Ling Wu, Tainan (TW); Yu-Yun Lo, Tainan (TW); Po-Jen Su, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 13/707,292

(22) Filed: Dec. 6, 2012

(65) Prior Publication Data

US 2013/0221394 A1   Aug. 29, 2013

(30) Foreign Application Priority Data

Feb. 24, 2012  (TW) .............................. 101106143 A

(51) Int. Cl.
*H01L 33/38* (2010.01)
*H01L 33/24* (2010.01)

(52) U.S. Cl.
USPC ..................................... 257/99; 257/E33.065

(58) Field of Classification Search
None
See application file for complete search history.

(56) References Cited

U.S. PATENT DOCUMENTS

| 8,476,644 | B2 * | 7/2013 | Illek et al. ........................ | 257/79 |
| 2003/0230754 | A1 * | 12/2003 | Steigerwald et al. ........... | 257/91 |
| 2008/0096297 | A1 * | 4/2008 | Schiaffino et al. .............. | 438/22 |
| 2011/0291120 | A1 * | 12/2011 | Tak et al. ......................... | 257/88 |
| 2012/0223359 | A1 * | 9/2012 | Han ................................. | 257/99 |
| 2012/0261695 | A1 * | 10/2012 | Chen et al. ...................... | 257/98 |
| 2013/0020603 | A1 * | 1/2013 | Jeong .............................. | 257/98 |
| 2013/0049056 | A1 * | 2/2013 | Choi ............................... | 257/98 |
| 2013/0112998 | A1 * | 5/2013 | Chen et al. ...................... | 257/79 |

* cited by examiner

*Primary Examiner* — Thomas L Dickey
*Assistant Examiner* — Joseph Schoenholtz
(74) *Attorney, Agent, or Firm* — Muncy, Geissler, Olds & Lowe, P.C.

(57) ABSTRACT

A light emitting diode (LED) is revealed. The LED includes a substrate, a first-type-doped layer, a light emitting layer, a second-type-doped layer, a plurality of first grooves, a second groove, an insulation layer, a first contact, and a second contact. The LED features that the second groove is connected to one end of each first groove and penetrates the second-type-doped layer and the light emitting layer to expose a part of the first-type-doped layer. The contact area between the first contact and the first-type-doped layer is increased. Therefore, the LED is worked at high current densities without heat accumulation. Moreover, the light emitting area is not reduced and the light emitting efficiency is not affected. The LED is flipped on a package substrate to form a flip-chip LED package.

18 Claims, 14 Drawing Sheets

LIGHT EMITTING DIODE AND FLIP-CHIP LIGHT EMITTING DIODE PACKAGE

BACKGROUND OF THE INVENTION

1. Field of the Invention

The present invention relates to a light emitting diode (LED) and a flip-chip LED package, and particularly to an LED and a flip-chip LED package applicable to high current densities.

2. Description of Related Art

Electrical energy is one of the indispensable energy sources used nowadays. Many facilities, including lighting devices, home appliances, communication devices, transportation vehicles, or industrial equipment, cannot operate without electrical energy. The majority of current worldwide energy is generated by burning fuels such as petroleum or coal. However, the supply of petroleum or coal is not inexhaustible. The current rate of fuel usage will lead to an energy crisis. There is an urgent need to develop alternative energy sources to cope with the global energy crisis. Besides actively developing various kinds of renewable energy, people also need to use energy in an economical and efficient way for enhancing the utilization efficiency of energy.

Take lighting equipment as an example. Lighting equipment is essential to our daily lives. Lights with higher luminance and lower power consumption are developed along with the rapid development of modern technology. A light emitting diode (LED) is one of the most popular light sources available now. Compared with conventional light sources, an LED has the properties of compact volume, low power consumption, good light-emitting efficiency, long lifetime, fast response time, no heat radiation, and no pollutants such as mercury. Thus, the LED has been used widely in recent years. The conventional light sources have not been replaced by LEDs due to brightness problems. However, thanks to the continuous technical enhancements, the high brightness LED (the high-power LED) has been invented currently and is capable of replacing conventional light sources.

The conventional LED at least includes one substrate, an n-type semiconductor layer, a light emitting layer, a p-type semiconductor layer, an n-type electrode, and a p-type electrode. At least one trench is formed on the p-type semiconductor layer by etching and the trench is extended to the n-type semiconductor layer. The n-type electrode is disposed on the n-type semiconductor layer. The smaller the area of the trench is, the larger the light emitting area of the LED is. The heat accumulation problem occurs while the LED is worked at high current density and the contact area between the n-type electrode and the n-type semiconductor layer is quite small. On the other hand, the larger the area of the trench is, the smaller the light emitting area of the LED is. This leads to reduction in the light emitting efficiency of the LED.

In order to solve the above problems, there is a need to provide an LED and a flip-chip LED package in which the contact area between a first contact (n-type electrode) and a first-type-doped layer (n-type semiconductor layer) is controlled within a certain range. Thus, the LED can be worked at high current densities without heat accumulation. Moreover, the light emitting area of the LED is not reduced and the light emitting efficiency of the LED is not affected.

SUMMARY OF THE INVENTION

Therefore, it is a primary object of the present invention to provide an LED and a flip-chip LED package that are worked at high current densities without heat accumulation.

It is another object of the present invention to provide an LED and a flip-chip LED package in which the current distribution is uniform, the light emitting area is not reduced, and hence the light emitting efficiency is not affected.

In order to achieve the above objects, an LED of the present invention includes a substrate, a first-type-doped layer, a light emitting layer, a second-type-doped layer, a plurality of first grooves, a second groove, an insulation layer, a first contact, and a second contact. The first-type-doped layer is disposed on the substrate; the light emitting layer is disposed on the first-type-doped layer; and the second-type-doped layer is disposed on the light emitting layer. The first grooves penetrate the second-type-doped layer and the light emitting layer and expose a part of the first-type-doped layer. Each first groove consists of a first end and a second end. The second groove is connected to the first end of each first groove. The second groove and the first grooves are extended in different directions. The second groove penetrates the second-type-doped layer and the light emitting layer, allowing a part of the first-type-doped layer exposed. The insulation layer is disposed on a part of the second-type-doped layer and extends to the sidewalls of the plurality of first grooves and the second groove. The first contact is arranged in the plurality of first grooves and the second groove and is electrically connected to the first-type-doped layer. The second contact is disposed on and electrically connected to the second-type-doped layer. There is an interval between the end where each first groove connects to the second groove and the edges of the light emitting layer and the second-type-doped layer.

In order to achieve the above objects, a flip-chip LED package includes a package substrate and an LED flipped over and electrically connected to the package substrate. The LED comprises a substrate, a first-type-doped layer, a light emitting layer, a second-type-doped layer, a plurality of first grooves, a second groove, an insulation layer, a first contact, and a second contact. The first-type-doped layer is disposed on the substrate; the light emitting layer is disposed on the first-type-doped layer; and the second-type-doped layer is disposed on the light emitting layer. The first grooves penetrate the second-type-doped layer and the light emitting layer and expose a part of the first-type-doped layer. Each first groove consists of a first end and a second end. The second groove is connected to the first end of each first groove. The second groove and the first grooves are extended in different directions. The second groove penetrates the second-type-doped layer and the light emitting layer, allowing a part of the first-type-doped layer exposed. The insulation layer is disposed on a part of the second-type-doped layer, and extends to the sidewalls of the plurality of first grooves and the second groove. The first contact is arranged in the plurality of first grooves and the second groove and is electrically connected to the first-type-doped layer. The second contact is disposed on and electrically connected to the second-type-doped layer. There is an interval between the end where each first groove connects to the second groove and the edges of the light emitting layer and the second-type-doped layer.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
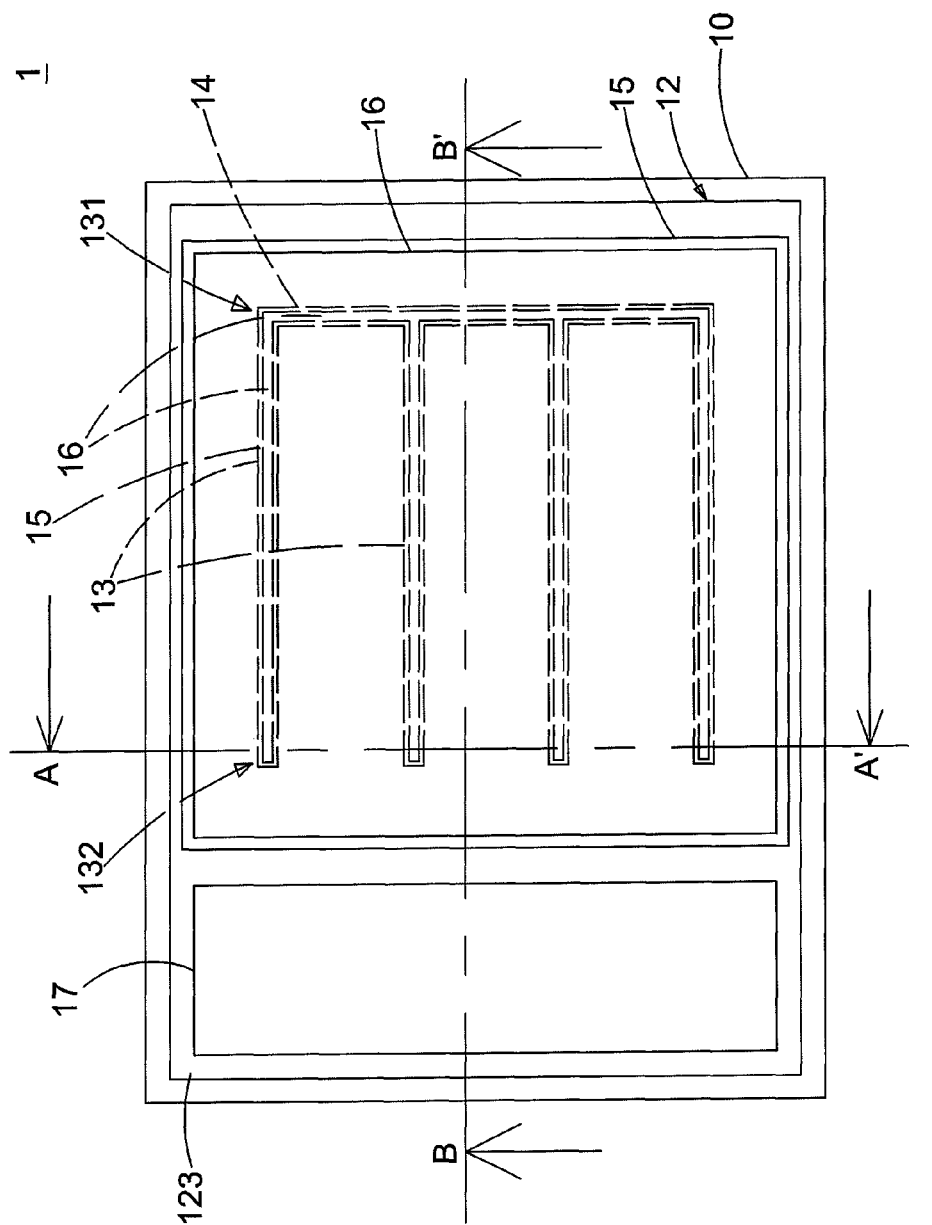
FIG. 1 is a top view of an embodiment according to the present invention.
Figure 2A:
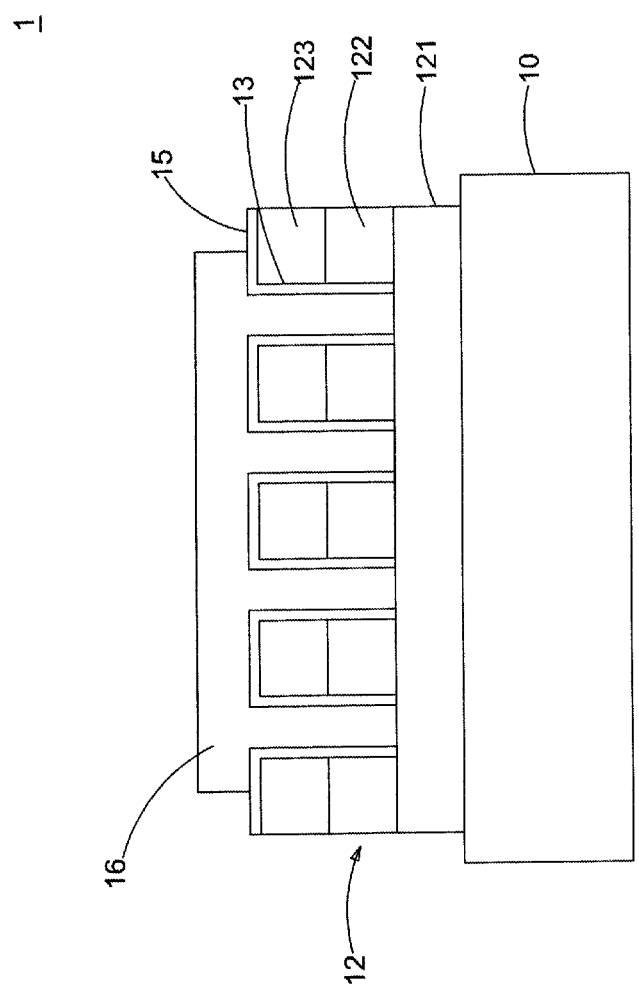
FIG. 2A is a cross-sectional view along AA' line of the embodiment in FIG. 1.
Figure 2B:
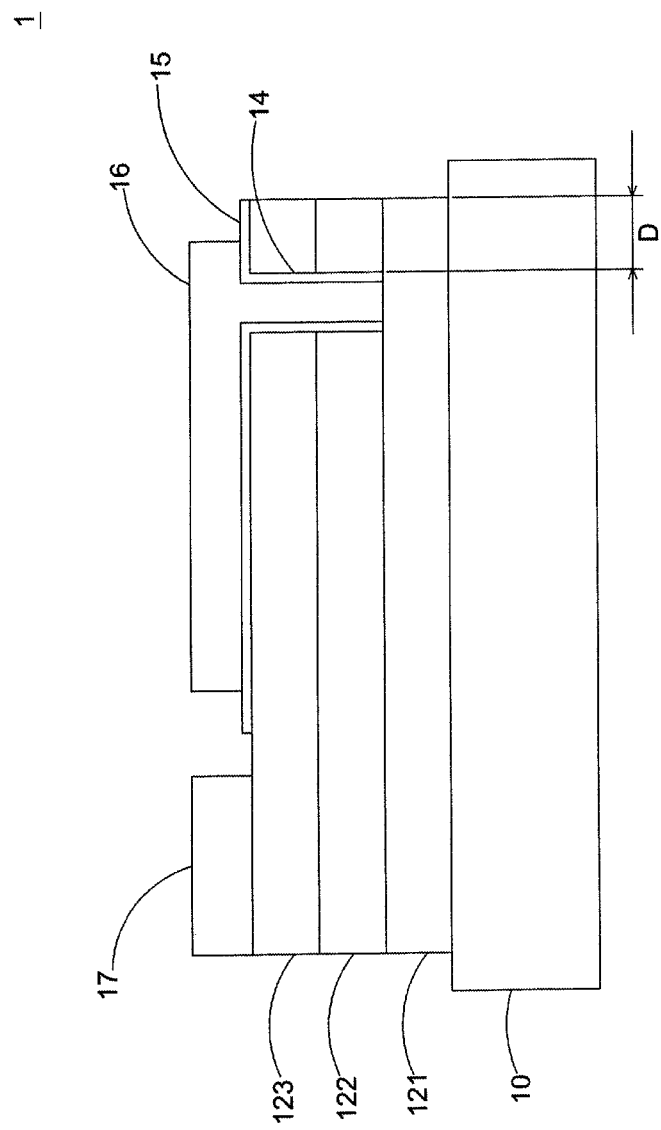
FIG. 2B is a cross-sectional view along BB' line of the embodiment in FIG. 1.

Referring to FIG. 1, FIG. 2A and FIG. 2B, an embodiment of a light emitting diode (LED) 1 according to the present invention includes a substrate 10, an epitaxial structure 12, a plurality of first grooves 13, a second groove 14, an insulation layer 15, a first contact 16, and a second contact 17. The epitaxial structure 12 is disposed on the substrate 10. The epitaxial structure 12 consists of a first-type-doped layer 121, a light emitting layer 122, and a second-type-doped layer 123.

The first-type-doped layer 121 is disposed on the substrate 10. The light emitting layer 122 is disposed on the first-type-doped layer 121 and the second-type-doped layer 123 is disposed on the light emitting layer 122. The plurality of first grooves 13 and the second groove 14 (the dashed lines in FIG. 1) are formed on the epitaxial structure 12, penetrating the second-type-doped layer 123 and the light emitting layer 122 and allowing a part of the first-type-doped layer 121 to be exposed. Each of the first grooves 13 includes a first end 131 and a second end 132. The second groove 14 connects the first end 131 of each first groove 13. The second end 132 of each first groove 13 is extended toward the center of the light emitting diode 1. The extension direction of the second groove 14 is different from that of the first grooves 13. There is an interval D between the second groove 14 and edges of the light emitting layer 122 and the second-type-doped layer 123, as shown in FIG. 2B. The insulation layer 15 is disposed on a part of the second-type-doped layer 123, extending toward the first grooves 13 and the second groove 14, and covering sidewalls of the plurality of first grooves 13 and the second groove 14. And a part of the first-type-doped layer 121 is exposed. The first contact 16 is arranged on the first-type-doped layer 121 inside the first grooves 13 and the second groove 14. The first contact 16 is electrically connected to the first-type-doped layer 121. The second contact 17 is disposed on and electrically connected to the second-type-doped layer 123. The first contact 16 is insulated from the second-type-doped layer 123 by the insulation layer 15.

The disposition of the plurality of first grooves 13 and the second groove 14 of the LED 1 makes the contact area between the first contact 16 and the first-type-doped layer 121 increase. And the current is spread in both vertical and lateral directions inside the first-type-doped layer 121. Thus, current is distributed uniformly between the first contact 16 and the second contact 17. Thus, the LED 1 can be worked at high current densities.

Figure 2C:
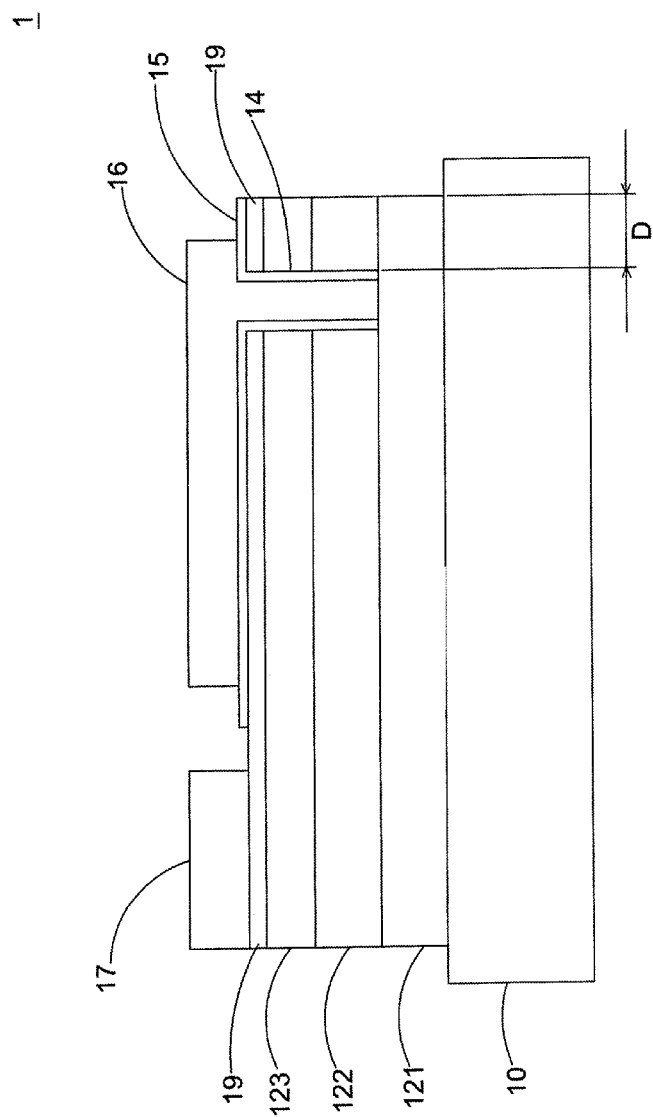
FIG. 2C is a cross-sectional view of the embodiment in FIG. 1.

Referring to FIG. 2C, the LED 1 further includes a reflective layer 19 disposed on the second-type-doped layer 123. The area of the reflective layer 19 is at least 50% of the area of the second-type-doped layer 123. When the LED 1 emits, the light from the light emitting layer 122 and illuminating upward is reflected by the reflective layer 19 due to the reflective layer 19 arranged over the light emitting layer 122. Then the reflected light is emitted from the substrate 10. The light can be emitted from the back surface. Thus, the LED 1 can be applied to flip-chip modules.

Figure 3:
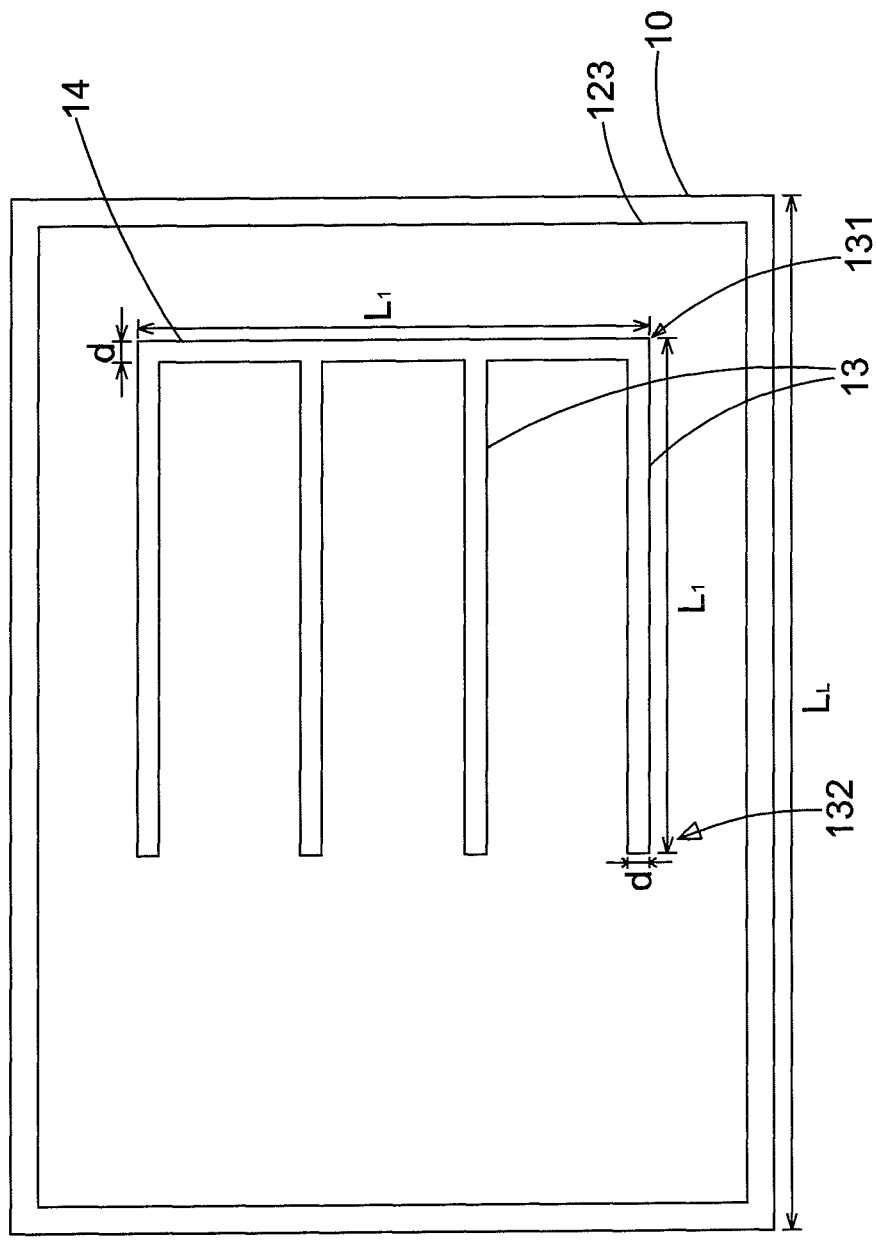
FIG. 3 is a schematic drawing showing first grooves and a second groove of an embodiment according to the present invention.

Refer to FIG. 3, in this embodiment, the first grooves 13 and the second groove 14 are all in a linear form and are perpendicular to each other. When the width d of each first groove 13 or of the second groove 14 is excessively small, the contact area between the first contact 16 and the first-type-doped layer 121 is reduced. Thus, not only the manufacturing processes are getting difficult but the yield rate is also reduced. Moreover, the LED 1 is unable to be worked at high current densities due to heat accumulation. Once the width d of each first groove 13 or the second groove 14 is excessively large, the manufacturing processes are simple and the yield rate is improved. Yet the contact surface between the first contact 16 and the first-type-doped layer 121 is also increased. Thus, the light emitting surface of the LED 1 is reduced. This leads to decreased light emitting efficiency of the LED 1. In this embodiment, the width d of each first groove 13 or of the second groove 14 is ranging from 10 micrometers to 100 micrometers. And the total area of the first grooves 13 and the second groove 14 is ranging from 5% to 15% of the area of the first-type-doped layer 121. Thus, not only the yield rate of the LED 1 is not reduced, the LED 1 can also be worked at high current densities without heat accumulation therein.

Furthermore, in order to keep balance between larger light emitting area and current spreading within the first-type-doped layer 121, the shortest distance $L_1$ between the first end 131 and the second end 132 of the first groove 13 is ranging from $0.5L_L$ to $L_L$, $L_L$ represents the length of a longer side of the substrate 10. In this embodiment, the first groove 13 is linear grooves. Thus, the shortest distance $L_1$ of the first groove 13 is equal to the length of the first groove 13.

Figure 4:
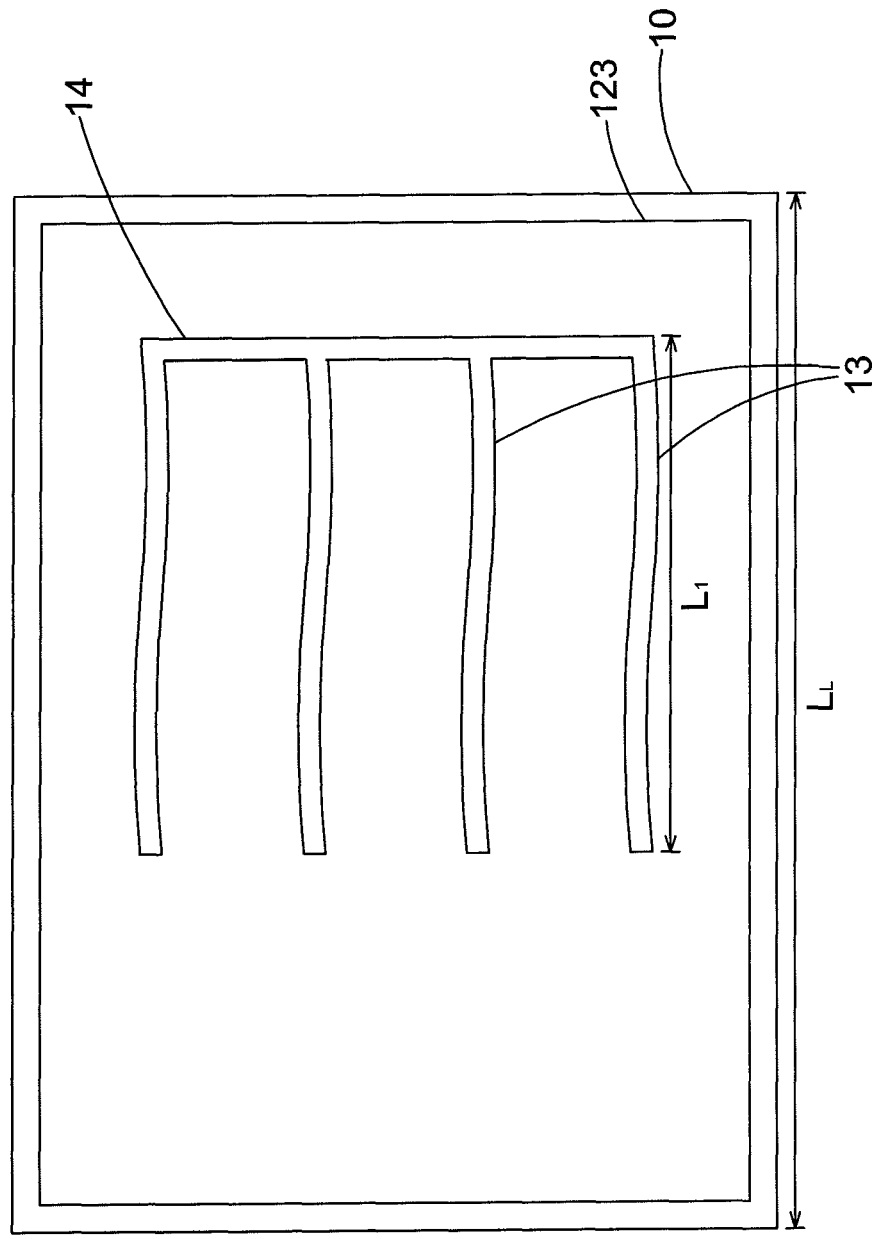
FIG. 4 is a schematic drawing showing first grooves and a second groove of another embodiment according to the present invention.
Figure 5:
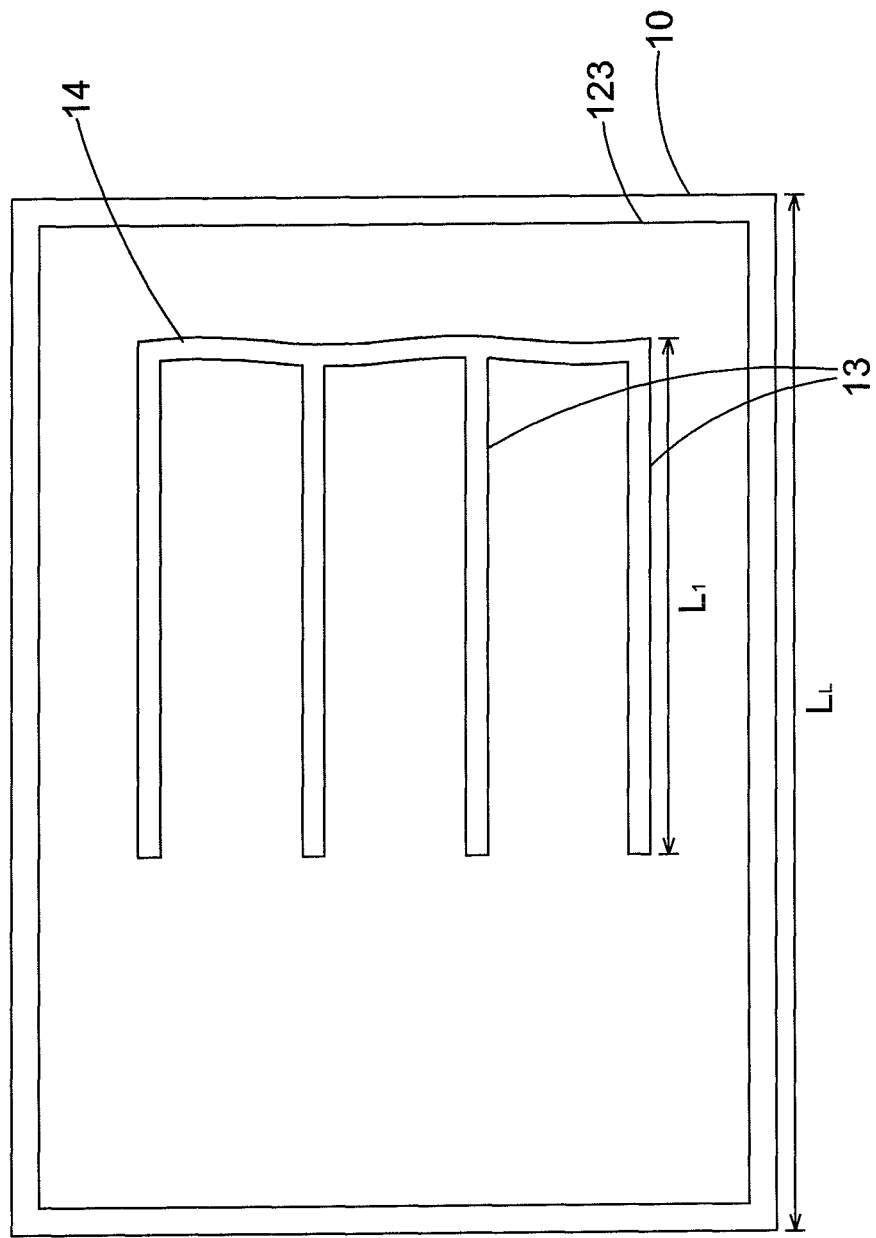
FIG. 5 is a schematic drawing showing first grooves and a second groove of a further embodiment according to the present invention.
Figure 6:
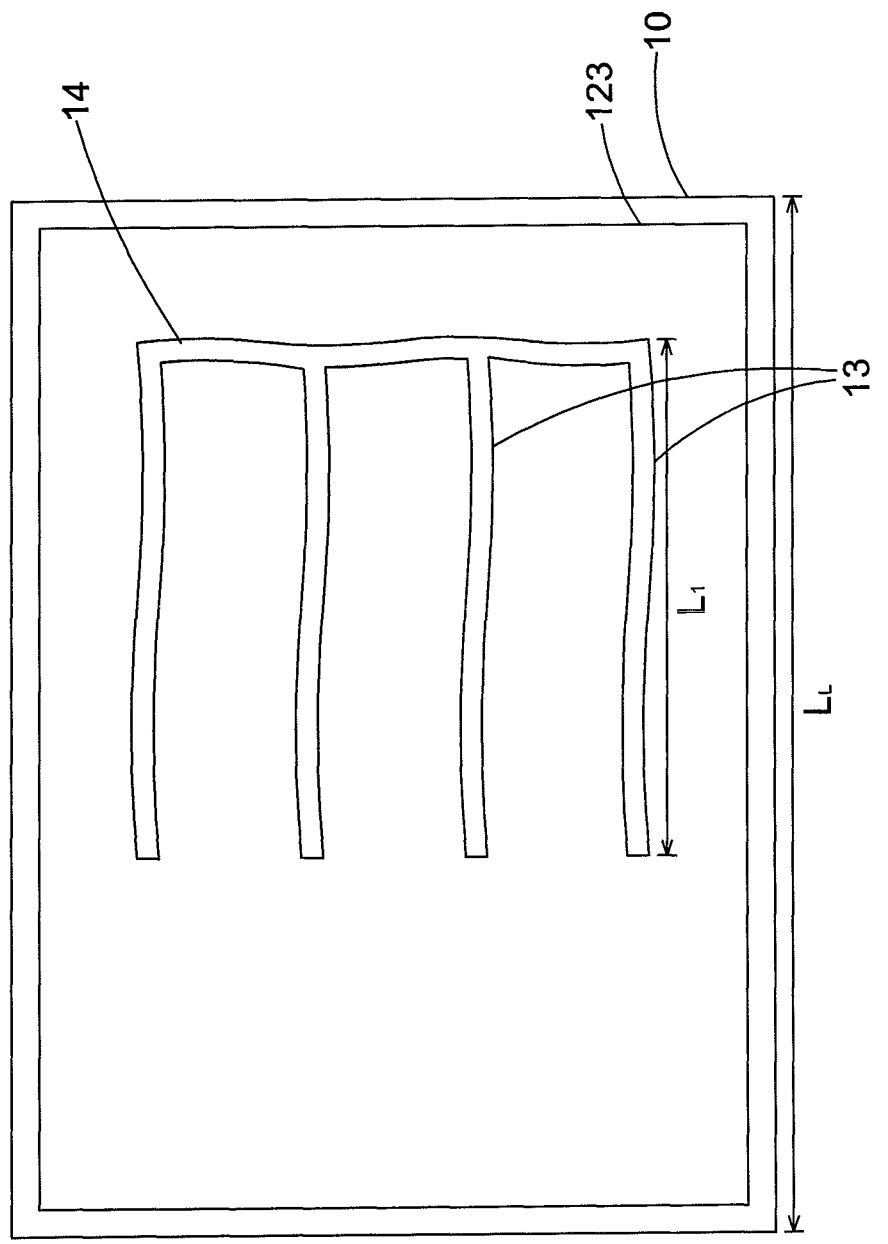
FIG. 6 is a schematic drawing showing first grooves and a second groove of a further embodiment according to the present invention.

Refer to FIG. 4, FIG. 5 and FIG. 6, some other embodiments of the present invention are disclosed. In FIG. 4, each first groove 13 is a curved groove while the second groove 14 is linear. In FIG. 5, the first groove 13 is a linear groove while the second groove 14 is a curved groove. In FIG. 6, both the first groove 13 and the second groove 14 are curved. Thus, the first groove 13 and the second groove 14 can both be linear or curved. Alternatively, one is a curved groove while the other is a linear groove. Once the first groove 13 and the second groove 14 are both curved grooves, the contact area between the first contact and the first-type-doped layer 121 is increased. Thus, the amount of current flowing through the light emitting layer 122 is increased and the light emitting efficiency of the LED 1 is improved.

Figure 7:
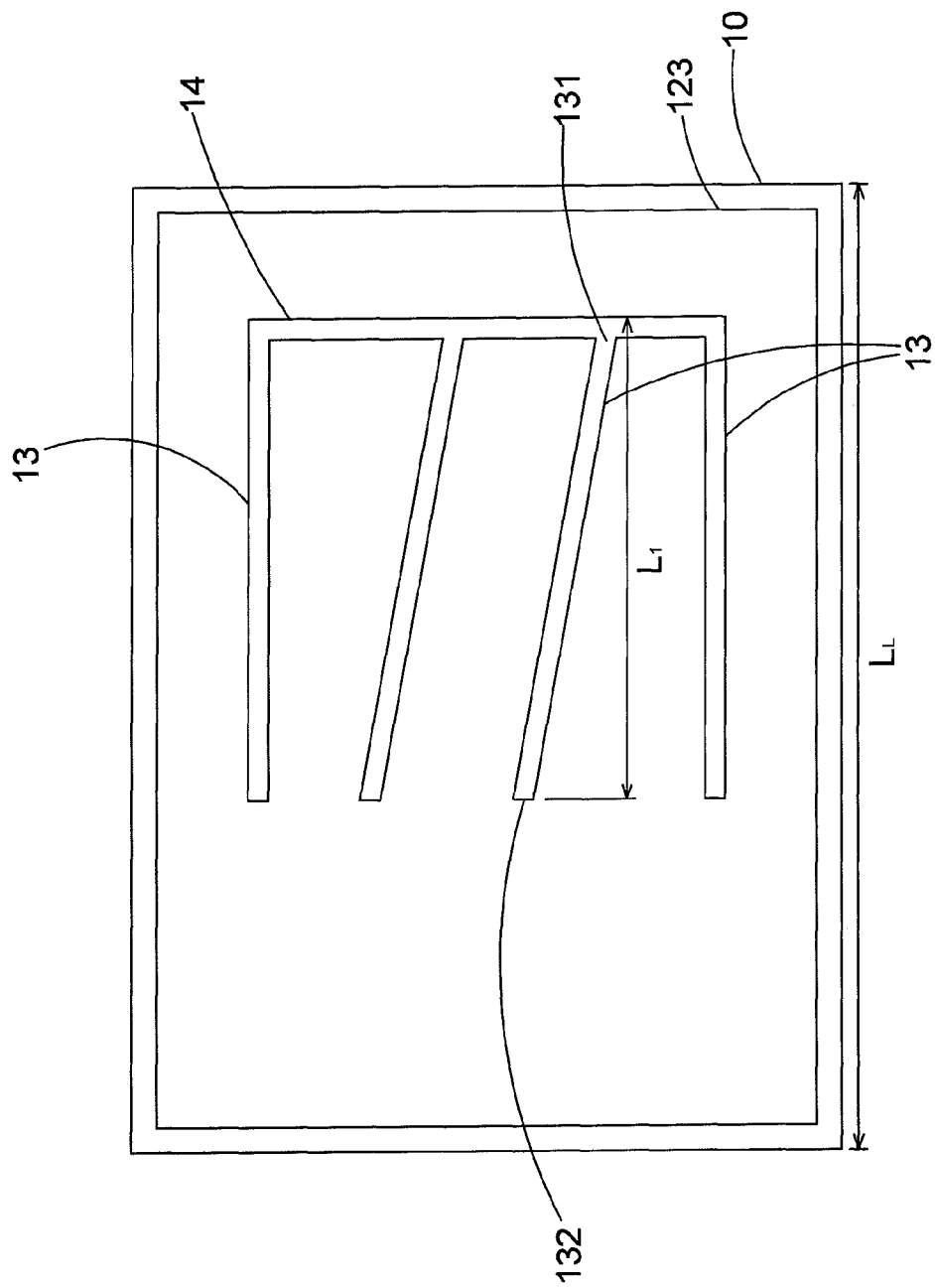
FIG. 7 is a schematic drawing showing first grooves and a second groove of a further embodiment according to the present invention.

Refer to FIG. 7, a further embodiment is revealed. Compared with the above embodiments in which all the first grooves 13 are parallel with one another, there are only two first grooves 13 arranged in parallel in this embodiment. Other first grooves 13 arranged between the two parallel first grooves 13 are inclined. The shortest distance between the first end 131 and the second end 132 of the first groove 13 disposed between the two parallel first grooves 13 is $L_1$, ranging between $0.5L_L$ and $L_L$, and $L_L$ is the length of the longer side of the substrate 10. This embodiment shows that the first grooves 13 are not necessary to be parallel to one another. If all the first grooves 13 are arranged in parallel, the light emitting area of the LED is larger and the light emitting efficiency of the LED is further increased.

Figure 8:
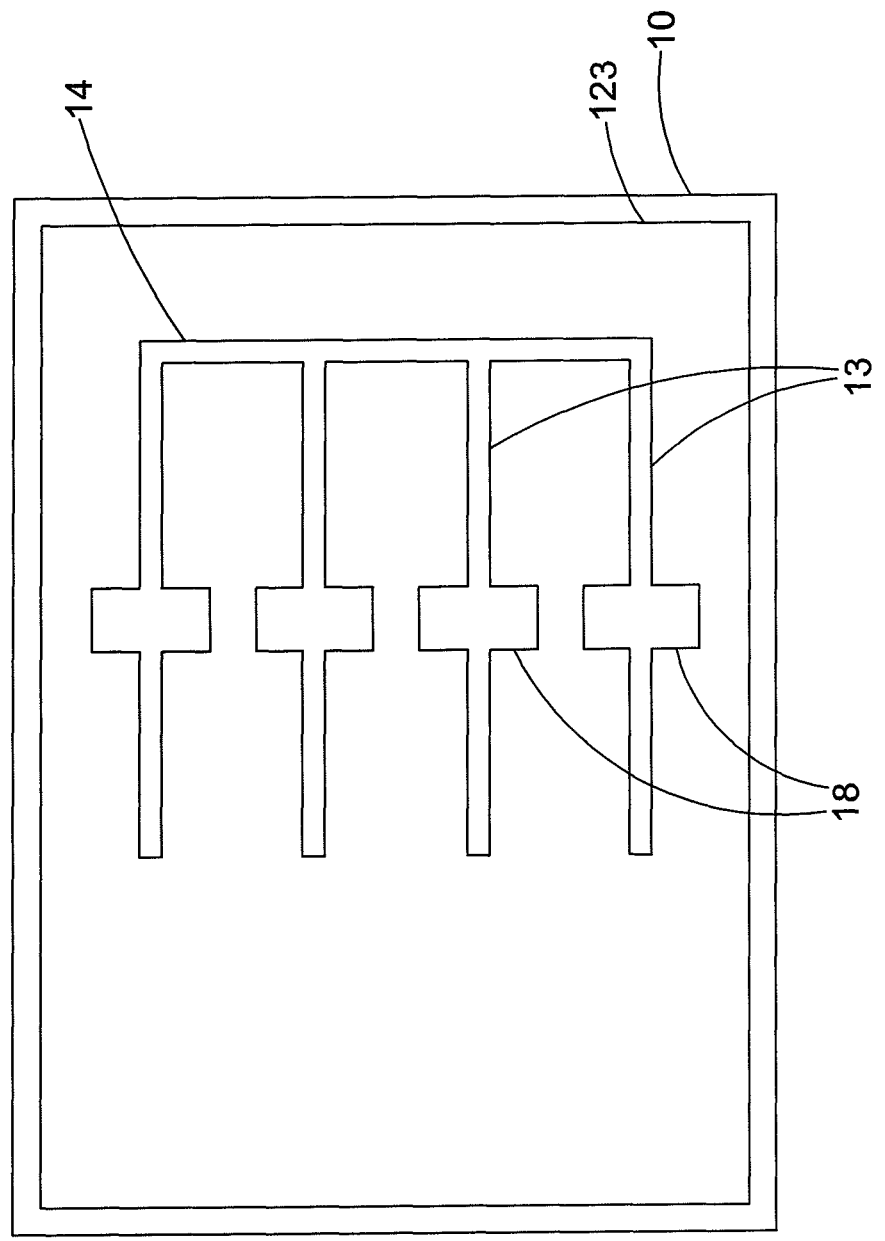
FIG. 8 is a schematic drawing showing first grooves and a second groove of a further embodiment according to the present invention.
Figure 9:
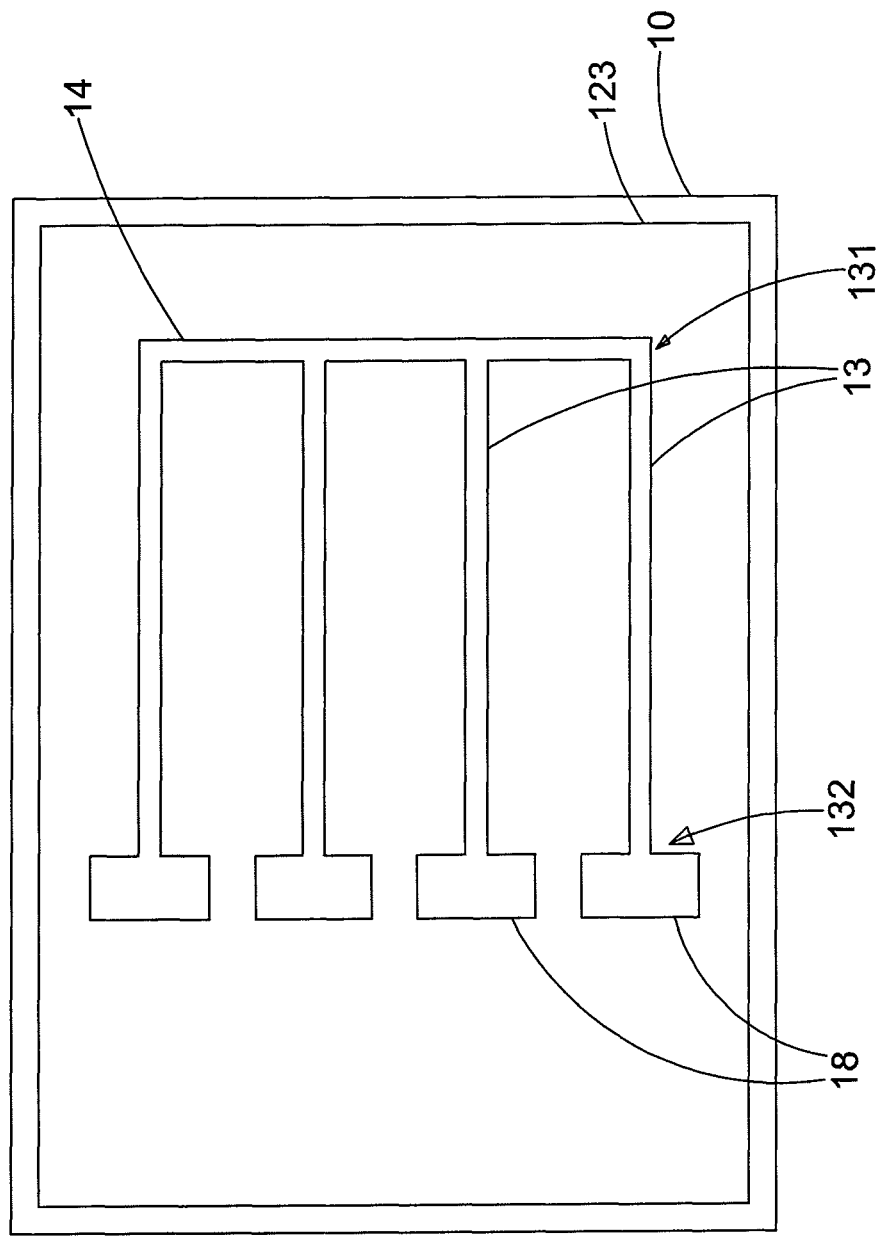
FIG. 9 is a schematic drawing showing first grooves and a second groove of a further embodiment according to the present invention.
Figure 10:
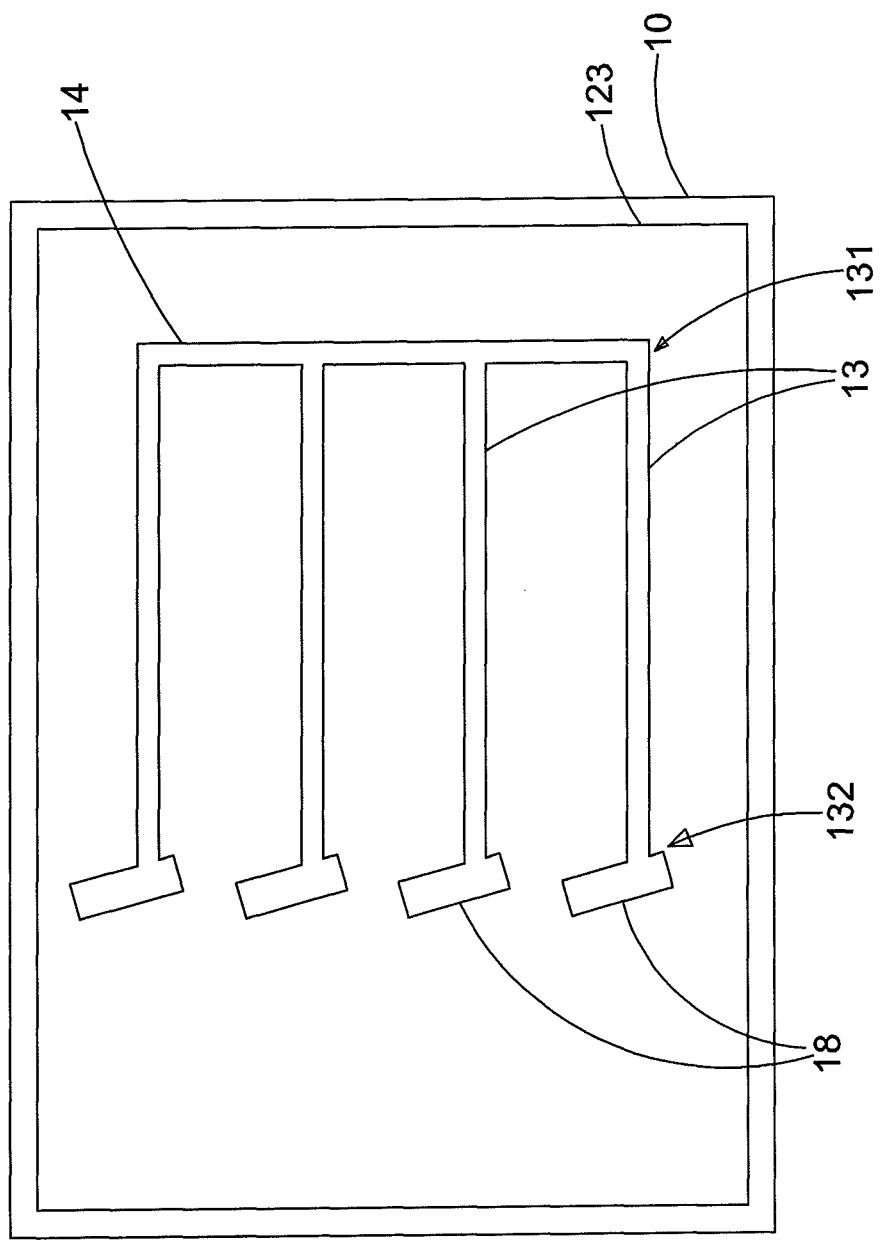
FIG. 10 is a schematic drawing showing first grooves and a second groove of a further embodiment according to the present invention.

Refer from FIG. 8 to FIG. 10, some further embodiments are revealed. The difference between these embodiments and the above embodiments is in that the LED 1 further includes a plurality of third grooves 18. The plurality of third grooves 18 are communicated with the plurality of first grooves 13. The third grooves 18 also penetrate the second-type-doped layer 123 and the light emitting layer 122, allowing a part of the first-type-doped layer 121 to be exposed and electrically connected to the first contact 16. In the embodiment shown in FIG. 8, there are four third grooves 18 that are linear and disposed at the middle part of each first grove 13, respectively. Refer to FIG. 9 and FIG. 10, the third grooves 18 are disposed on the second end 132 of each first groove 13. In these embodiments, the plurality of third grooves 18 and the plurality of first grooves 13 are extended in different directions. For example, in FIG. 8 and FIG. 9, the third groove 18 and the first groove 13 are perpendicular to each other. Or the third groove 18 is inclined upward relative to the first groove 13, as shown in FIG. 10. No matter which position the third groove 18 is disposed in the first groove 13, the lateral current spreading of the LED is increased as long as the third groove 18 and the first groove 13 are extended in different directions. The third groove 18 can also be a curved groove.

Figure 11:
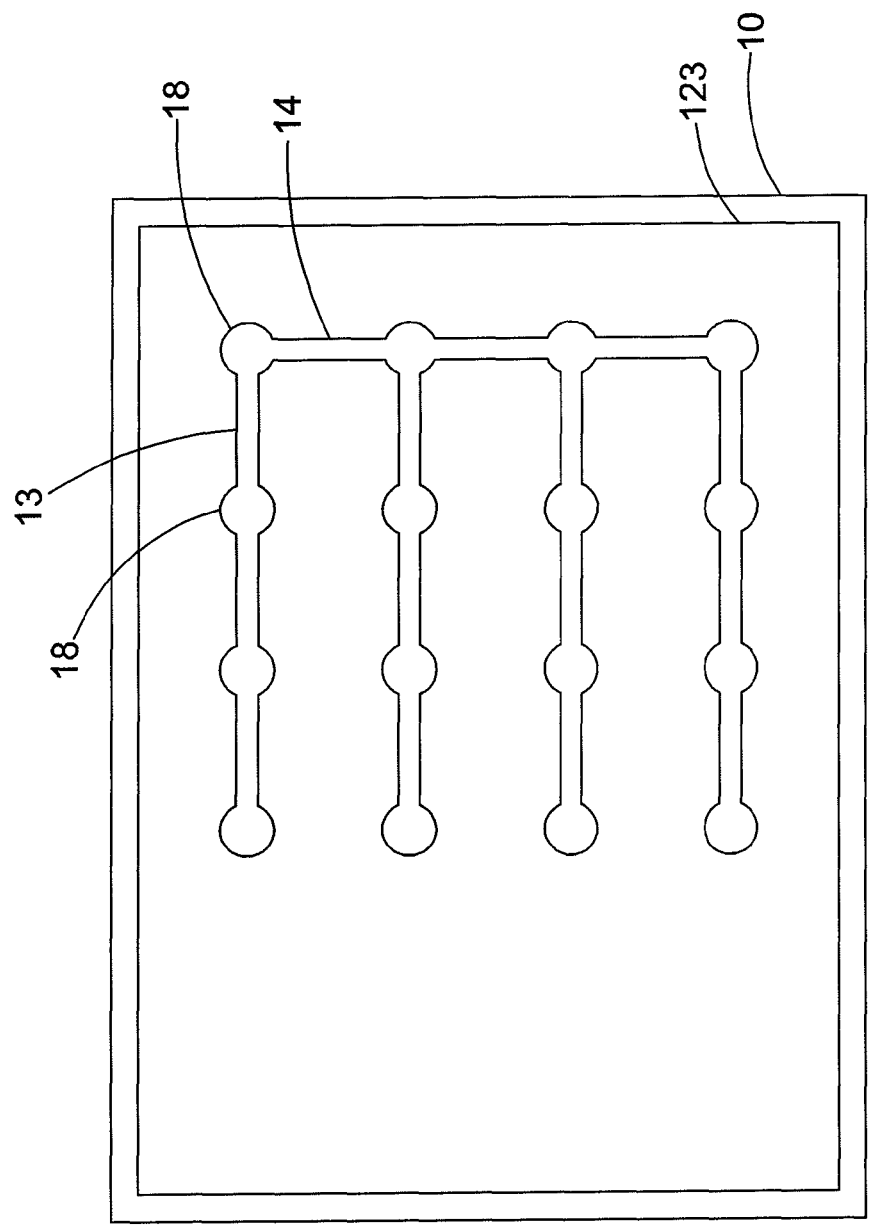
FIG. 11 is a schematic drawing showing first grooves and a second groove of a further embodiment according to the present invention.

Refer to FIG. 11, in order to increase lateral current spreading, the number of the third groove 18 arranged in each first groove 13 can be increased. For example, the total number of the third grooves 18 is xn, wherein x is a positive integer greater than zero and n is the total number of the first grooves 13. That means there are x third grooves 18 arranged in each first groove 13. In this embodiment, there are three third grooves 18 disposed in each first groove 13. The third groove 18 is circular and the third grooves 18 are disposed in each first groove 13 at a fixed interval so as to increase the exposed area of the first-type-doped layer 121 in the lateral direction. Compared with the embodiments shown in FIG. 8 to FIG. 10, the current spreading in the lateral direction of the first-type-doped layer 121 in these embodiments is increased. The third grooves 18 can be linear or curved.

Figure 12:
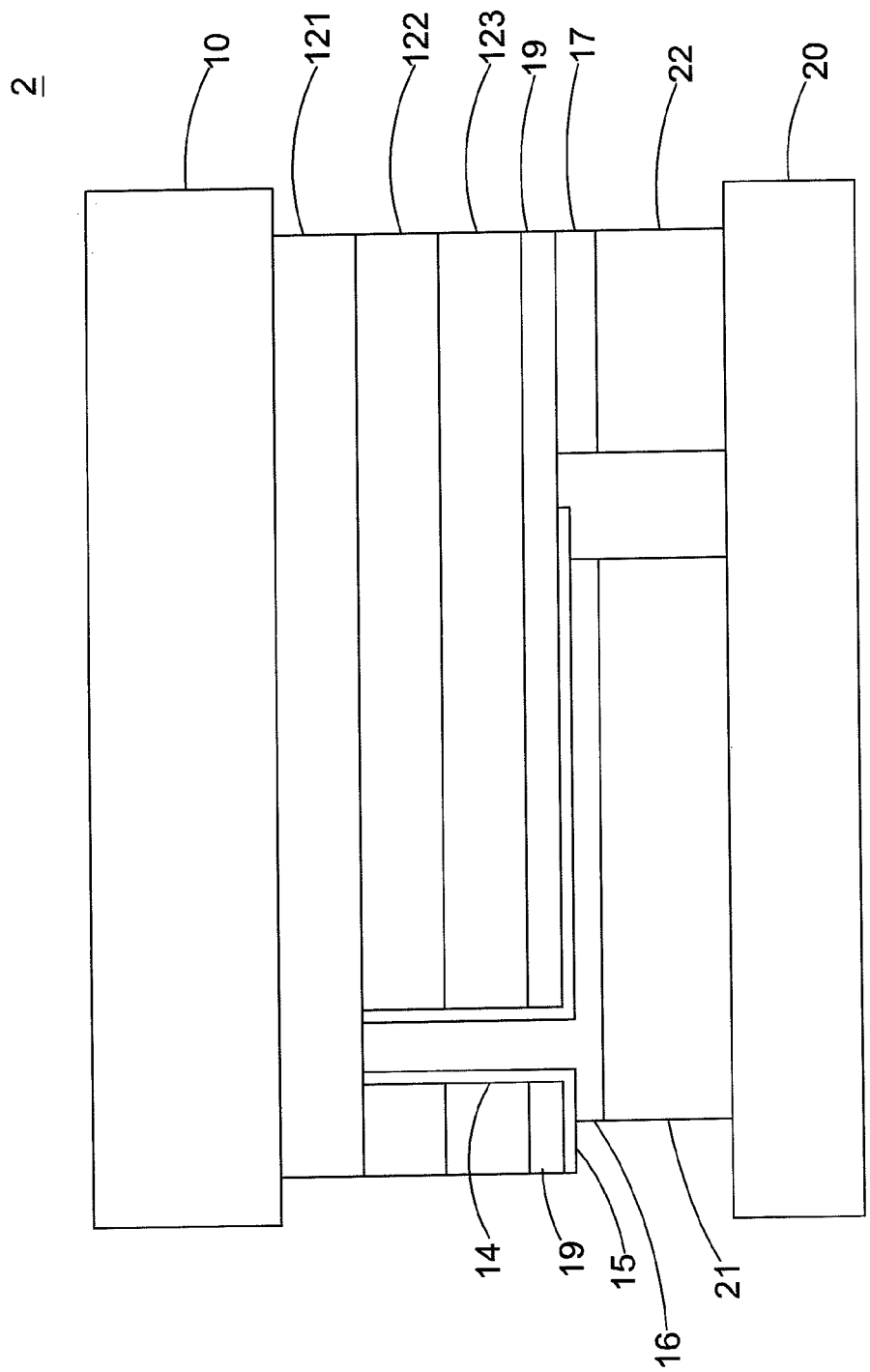
FIG. 12 is a schematic drawing showing an embodiment of a flip-chip LED package according to the present invention.

Refer to FIG. 12, a flip-chip LED package 2 is obtained by employing the flip chip packaging to the LED 1. The LED 1 of the embodiment shown in FIG. 1 is flipped on a package substrate 20. The first contact 16 and the second contact 17 are electrically connected to the package substrate 20 by eutectic structures 21, 22, respectively. The first contact 16 and the second contact 17 can also be electrically connected to the package substrate 20 by two metal bumps, respectively. In this embodiment, the flip-chip LED package 2 further includes a reflective layer 19 disposed between the second-type-doped layer 123 and the first contact 16/the second contact 17. The area of the reflective layer is at least 50% of the area of the second-type-doped layer 123. When the flip-chip LED package 2 emits light, the light from the light emitting layer 122 traveling downward is reflected by the reflective layer 19 and emitted from the substrate 10 because the reflective layer 19 is located below the light emitting layer 122. Thus, the light emitting efficiency is increased. Other embodiments of the LED 1 can also be packaged in flip-chip packages to give the flip-chip LED package 2.

In addition, the material of the substrate 10 is selected from the group consisting aluminum oxide ($Al_2O_3$), silicon carbide (SiC), gallium arsenide (GaAs), gallium nitride (GaN), gallium phosphide (GaP), aluminum nitride (AlN), silicon (Si), zinc oxide (ZnO), manganese oxide (MnO), or glass. The first-type-doped layer 121 and the second-type-doped layer 123 are, respectively, GaN (gallium nitride)-based semiconductor layers doped with different impurities. The first-type-doped layer 121 is n-type GaN-based semiconductor layer and the second-type-doped layer 123 is p-type GaN-based semiconductor layer. Or the first-type-doped layer 121 is p-type GaN-based semiconductor layer and the second-type-doped layer 123 is n-type GaN-based semiconductor layer. The light emitting layer 122 can be a multiple-quantum-well (MQW) structure. The insulation layer 15 is made from insulation materials with high transparency, including oxides, nitrides, and nitrogen oxides. The preferred material for the insulation layer 15 is silicon oxide, silicon nitride or silicon oxynitride. The preferred materials for the reflective layer 19 are metals with high reflectivity, such as silver, aluminum, titanium, gold, platinum, palladium, or their combinations. The materials for the first contact 16 and the second contact 17 are electrically conductive, including conductive metals and non-metals with electrically conductive properties. The conductive metals are preferred, including gold, titanium, nickel, aluminum, chromium, platinum, or their combinations. The structure of the electrically conductive materials can be a single layer or a plurality of layers stacked. In this embodiment, each eutectic structure 21, 22 is made from eutectic metals that are alloys such as Au—Sn (gold-stannum) alloy, Ag—Sn (silver-stannum) alloy, Au—Ge (gold-germanium alloy), etc. The metal bump is made from metals including gold, nickel, solder tin, etc.

In summary, the present invention provides an LED and a flip-chip LED package. By the first grooves and the second groove penetrating the second-type-doped layer and the light emitting layer, a part of the first-type-doped layer is exposed to be disposed with and electrically connected to the first contact. Thus, the current distribution in both vertical and lateral directions inside the first-type-doped layer is increased. Moreover, by the third grooves connected to the first grooves and extended in the direction different from that of the first grooves, the lateral current spreading in the first-type-doped layer is increased. Thus, the current distribution in the LED is more uniform and the light emitting efficiency of the LED is further increased.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A light emitting diode (LED), comprising:
 a substrate;
 a first-type-doped layer, disposed on the substrate;

a light emitting layer, disposed on the first-type-doped layer;

a second-type-doped layer, disposed on the light emitting layer;

a plurality of first grooves, each of which penetrating the second-type-doped layer and the light emitting layer so that a part of the first-type-doped layer is exposed, each of the first grooves having a first end and a second end;

a second groove, connected to the first end of each first groove, and is penetrating the second-type-doped layer and the light emitting layer so that a part of the first-type-doped layer is exposed, and the second groove and the first grooves extending in different directions;

an insulation layer, disposed on a part of the second-type-doped layer and extended to sidewalls of the first grooves and the second groove;

a first contact, arranged in the first grooves and the second groove, and electrically connected to the first-type-doped layer; and a second contact, disposed on the second-type-doped layer, and electrically connected to the second-type-doped layer;

wherein there is an interval between the second groove and edges of the second-type-doped layer and the light emitting layer.

2. The LED as claimed in claim 1, wherein the LED further includes a reflective layer disposed on the second-type-doped layer.

3. The LED as claimed in claim 2, wherein a total area of the reflective layer is at least 50% of an area of the second-type-doped layer.

4. The LED as claimed in claim 1, wherein a total area of the first grooves and the second groove is ranging from 5% to 15% of an area of the first-type-doped layer.

5. The LED as claimed in claim 1, wherein the first grooves and the second groove are linear, respectively, and perpendicular to each other.

6. The LED as claimed in claim 1, wherein the first grooves are curved or the second groove is curved.

7. The LED as claimed in claim 1, wherein at least two of the first grooves are arranged in parallel to each other.

8. The LED as claimed in claim 1, wherein a shortest distance between the first end and the second end of the first groove is ranging from $0.5L_L$ to $L_L$, and $L_L$ representing a length of a longer side of the substrate.

9. The LED as claimed in claim 1, wherein a width of the first groove and a width of the second groove are ranging from 10 micrometers to 100 micrometers, respectively.

10. The LED as claimed in claim 1, wherein the second end of the first groove is extended toward a center of the LED.

11. The LED as claimed in claim 1, and further includes a plurality of third grooves communicating with the plurality of first grooves, and penetrating the second-type-doped layer and the light emitting layer and exposing a part of the first-type-doped layer.

12. The LED as claimed in claim 11, wherein a total number of the third grooves is xn, wherein x is a positive integer greater than zero and n is a number of the first grooves.

13. The LED as claimed in claim 12, wherein the plurality of third grooves are arranged on the second end of the plurality of first grooves, respectively.

14. The LED as claimed in claim 11, wherein each of the third grooves is circular.

15. The LED as claimed in claim 11, wherein the plurality of third grooves are linear or curved and extend in a direction different from a direction of the first grooves.

16. A flip-chip light emitting diode (LED) package, comprising a package substrate; and
    a light emitting diode flipped on and electrically connected to the package substrate;
    wherein the light emitting diode comprising
    a substrate;
    a first-type-doped layer, disposed on the substrate;
    a light emitting layer, disposed on the first-type-doped layer;
    a second-type-doped layer, disposed on the light emitting layer;
    a plurality of first grooves, each of which penetrating the second-type-doped layer and the light emitting layer so that a part of the first-type-doped layer is exposed, each of the first grooves having a first end and a second end;
    a second groove that is connected to the first end of each of the first grooves, and is penetrating the second-type-doped layer and the light emitting layer so that a part of the first-type-doped layer is exposed and the second groove and the first grooves extending in different directions;
    an insulation layer, disposed on a part of the second-type-doped layer and extended to sidewalls of the first grooves and the second groove;
    a first contact, arranged in the first grooves and the second groove and electrically connected to the first-type-doped layer; and
    a second contact, disposed on the second-type-doped layer and electrically connected to the second-type-doped layer;
    wherein there is an interval between one end where the first groove connects to the second groove and the edges of the second-type-doped layer and the light emitting layer.

17. The LED package as claimed in claim 16, wherein the LED package is electrically connected to the package substrate by two metal bumps.

18. The LED package as claimed in claim 16, wherein the LED package is electrically connected to the package substrate by two eutectic structures.

* * * * *